United States Patent [19]

Brown et al.

[11] Patent Number: 5,002,493
[45] Date of Patent: Mar. 26, 1991

[54] PANEL MOUNTED ELECTRONIC ASSEMBLY

[75] Inventors: Thomas E. Brown, Mechanicsburg; Thomas F. Davis, Camp Hill, both of Pa.

[73] Assignee: AMP Incorporated, Harrisburg, Pa.

[21] Appl. No.: 407,762

[22] Filed: Sep. 19, 1989

[51] Int. Cl.$^5$ .............................................. H01R 9/09
[52] U.S. Cl. ...................................... 439/65; 361/395; 439/91; 439/931; 29/848
[58] Field of Search ........................... 439/55, 65–74, 439/85, 91, 591, 86, 931; 29/830, 846, 848, 849; 361/395, 399

[56] References Cited

U.S. PATENT DOCUMENTS

| | | | |
|---|---|---|---|
| 3,042,591 | 7/1962 | Cado. | |
| 3,221,286 | 11/1965 | Fedde | 439/65 |
| 3,532,152 | 7/1985 | Elarde | 427/96 |
| 3,629,185 | 1/1967 | Schneble, Jr. et al. | |
| 3,907,621 | 9/1975 | Polichette et al. | 156/18 |
| 3,930,963 | 1/1976 | Polichette et al. | 204/15 |
| 3,951,493 | 4/1976 | Kozel et al. | 439/591 |
| 3,993,802 | 11/1976 | Polichette et al. | 427/98 |
| 3,994,727 | 11/1976 | Polichette et al. | 96/38.4 |
| 4,287,253 | 9/1981 | Leech | 428/323 |
| 4,511,597 | 4/1985 | Tera et al. | 427/53.1 |
| 4,529,257 | 7/1985 | Goodman et al. | 339/94 |
| 4,548,451 | 10/1985 | Benarr et al. | 439/85 |
| 4,594,311 | 6/1986 | Frisch et al. | 430/315 |
| 4,604,799 | 8/1986 | Gurol | 29/897 |
| 4,737,118 | 4/1988 | Lockard | 439/289 |
| 4,758,459 | 7/1988 | Mehta | 29/848 |
| 4,820,170 | 4/1989 | Redmond et al. | 439/66 |
| 4,921,453 | 5/1990 | O'Brien | 439/630 |

FOREIGN PATENT DOCUMENTS

| | | | |
|---|---|---|---|
| 0192233 | 2/1986 | European Pat. Off. | |
| 64-47090 | 2/1989 | Japan | 439/74 |

OTHER PUBLICATIONS

O'Brien, Jack, "Cast Spring"-A Plated, Molded Thermoplastic Electrical I/O Interface, Connection Technology, Jun. 1989, pp. 23-27.

Primary Examiner—Neil Abrams
Attorney, Agent, or Firm—Katherine A. Nelson

[57] ABSTRACT

An electronic assembly is disclosed comprising a molded dielectric connector means including an electronic package mounted therewithin, the connector means 80 being adapted to be secured to a framework. The connector means includes first and second molded member 82,110 securable together at an interface. The first molded member has outwardly facing surface portion including an interconnection region 94, and includes compliant spring portions 90 integral therewith portions and extending outwardly therefrom at the interface. The compliant spring portions 90 are adapted to be deflected by the second molded member 110 upon assembly of the molded members. Circuit means 92 are included on the first molded member 82 and are defined along the outside surface portions and extending along outwardly facing surface portions of the compliant spring portions 90 and further extending to interconnection region 94. The second molded member 110 includes a portion engagable with the compliant spring portion 90 and circuit means 164, defined on said engagable portion. Upon assembly of the first and second molded members the conductive portions 164 of the second molded member 110 are held under compression against the spring circuit surface 91 and upon mounting the assembly to said framework, the interconnection section 94 of the first molded member circuitry is electrically connected to corresponding contact means along the framework. In the preferred embodiment, resilient member 93 is used to support the spring arm portions 90 to minimize stress on the spring portions 90.

10 Claims, 8 Drawing Sheets

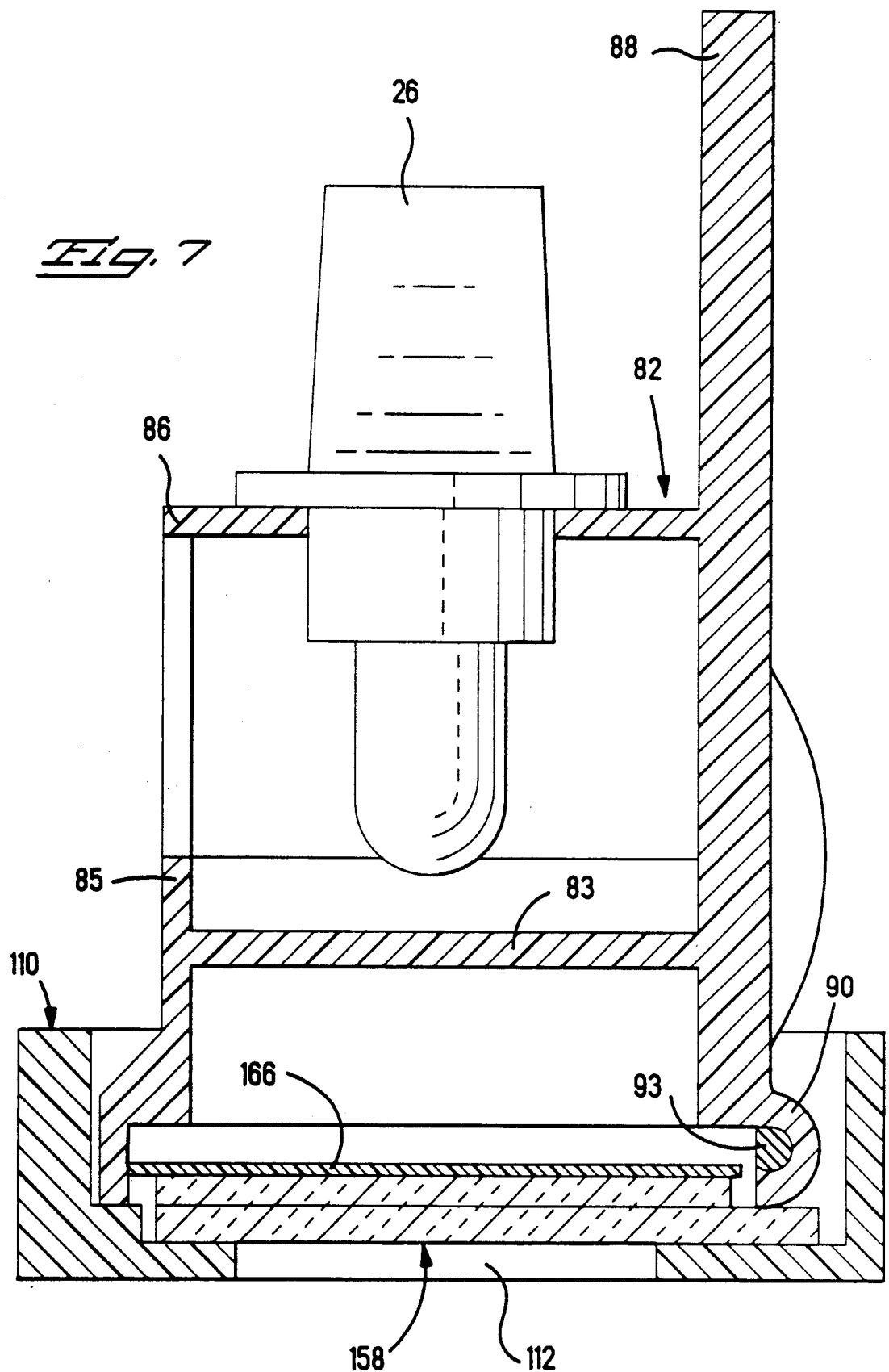

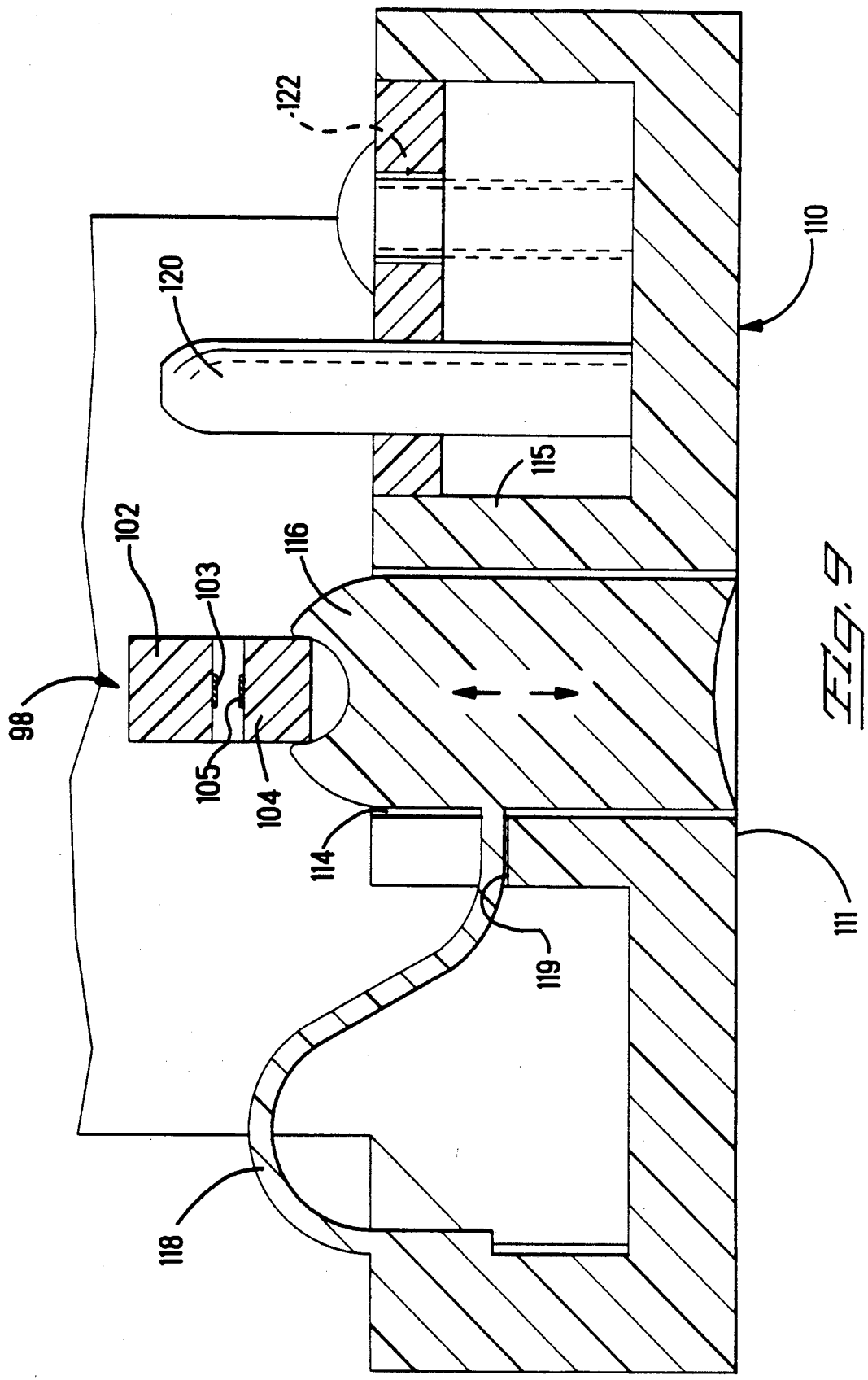

PANEL MOUNTED ELECTRONIC ASSEMBLY

FIELD OF THE INVENTION

The present invention is directed to electrical connectors and in particular to connectors having the capability of electrically engaging with circuitry on surfaces such as for example glass panels, liquid crystal displays and the like.

BACKGROUND OF THE INVENTION

There is an increasing need for multi-circuit packages for use with electronic assemblies and in the computer industry. As both complexity and miniaturization increases, the need for smaller size, lighter weight packaging and reliability has generated the need for connectors having the ability to reliably connect a large number of electrically conductive traces on closely spaced centerlines in compact areas. Furthermore, there are a number of electronic devices that utilize liquid crystal display units, and circuitry on glass panels and the like that cannot be electrically connected by means of individually soldered connections. The requirements of the industry have generated a class of connectors known as elastomeric connectors which can be disposed between circuitry on for example a printed circuit board and also on a glass panel to interconnect corresponding circuits while avoiding the use of solder. The elastomeric member provides sufficient normal force to maintain the electrical interconnection of the circuits yet the member has sufficient compliancy so as not to damage the glass or other panels.

U.S. Pat. No. 4,820,170 discloses one such layered elastomeric connector in which succeeding layers of dielectric material and conductive material are alternated so as to provide a plurality of closely spaced but electrically isolated conductive areas. Typically the elastomeric connector is a rectangular block such that each layer is exposed on all four sides of the block, thus enabling interconnection between circuits on parallel planes or between circuits on planes that meet at essentially right angles. Since the elastomeric connector is compressible and will expand outwardly when subjected to pressure, means must be provided to support the elastomeric block in order to control the direction of expansion and maintain the block in appropriate alignment and to provide dimensioned stability for the block. In using such an elastomeric connector, therefore, a separate support housing or a special cavity within a connector housing is required. These additional parts for providing interconnection add to the number of pieces that must be molded or otherwise formed in order to achieve and maintain the desired interconnection.

Instrument panels for automobiles, airplanes, computers and other equipment often include electronic packages such as digital clocks and the like which require interconnection to fragile surfaces such as glass panels having conductors thereon for example liquid crystal display units (LCDs). Typically such panel mounted electronic assemblies contain at least one printed circuit board having a variety of electronic components thereon, a housing for the components, electrical connectors interconnecting these components and at least one elastomeric connector to join the circuitry to an LCD or the like.

It is desirable, therefore, to provide a means for making electronic assemblies such as panel mounted assemblies with a minimum number of parts.

It is further desirable to minimize the steps in manufacturing such an assembly.

It is also desirable to have an assembly that is relatively lightweight and compact while maintaining the desired electronic capabilities of the more complex prior art devices.

The use of compliant spring arm contact members for providing surface mounting for components to surfaces such as circuit boards is known. These compliant spring arm member, however, are typically made of metal that has been stamped and formed into the desired configuration. While suitable for many applications, metal spring arms are not typically suitable for surface interconnection to fine line circuitry on panels such as glass panels and the like. Furthermore the stamping and forming of metal requires further manufacturing steps.

It is desirable, therefore, to have a compliant spring arm section formed essentially of dielectric material, which will eliminate the problems of possible damage to the surface of the glass as well as have a sufficient compression force to maintain electrical contact with the surface conductors.

Furthermore, it is desirable to maintain the features of spring contacts while eliminating stamping and forming steps required for metal members thus providing a cost effective method for manufacturing.

SUMMARY OF THE INVENTION

Accordingly, the present invention is directed to an electronic assembly that alleviates the disadvantages and problems of the prior art. The assembly includes a molded electrical connector having a plurality of compliant spring fingers molded integrally with a body portion, the spring fingers including contact means on surface portions that are exposed to be engaged by a mating article. The spring fingers are electrically engageable upon assembling the connector to a corresponding electrical connector having corresponding contact means that are engageable with the compliant spring fingers.

The invention is shown representatively as a panel mounted digital clock member having an electronic package mounted therewithin. The clock member is adapted to be secured in a framework such as a panel of a car. The connector means includes first and second molded members securable together at an interface. The first molded member has outwardly facing surface portions including an interconnection region, the first molded member further includes at least one compliant spring portion integral therewith at the interface. The at least one compliant spring portion is adapted to be deflected by a second molded member upon assembly of the molded members. The first molded member includes circuit means defined along at least outside surface portions and extending along outwardly facing surface portions of the compliant spring portion and further extending to the interconnection region. The second molded member includes a portion engageable with the compliant spring portion and circuit means defined on that engageable portion whereby when the first and second molded members are assembled together, the conductive portions of the second molded member are held under compression against the corresponding spring contact surfaces of the first member and upon mounting the assembly to a framework the interconnection sections of the first molded member circuitry are electrically connected to the corresponding contact means along the framework.

In the preferred embodiment, the first dielectric molded member includes a body and a plurality of spring arm portions molded from one material and further includes a second material that is resilient and provides support for the compliant spring portions. The second material also provides substantial resistance to compression to minimize stress on the corresponding compliant spring portions, and resist the tendency of the polymeric material to "creep" and "stress relax".

The resilient portion for the first molded member of the assembly may be made as a separate piece and assembled to the body member or preferably the body and the resilient portion may be molded according to dual injection molding techniques wherein the first material is formed into a first predetermined body shape, the core pins within the mold are then adjusted to define a second mold cavity at the desired location of the body member and the second or resilient material is injected into the second cavity of the mold. The dual injection molding technique is a cost effective method for providing an integral elastomeric type connector on a connector housing.

It is an object of the present invention to provide a means for making electronic assemblies having a minimum number of parts.

It is an additional object of the invention to provide a cost effective means to manufacture electronic assemblies.

It is another object of the invention to provide a molded connector member that maintains electrical interconnections even at elevated temperatures.

A further object of the invention is to provide a connector having an integrally formed compliant portion for electrical engagement circuitry on LCDs and the like.

The invention itself, together with further objects and attendant advantages of the invention will be best understood by reference to the following detailed description, taken in conjunction with the accompanying drawing.

BRIEF DESCRIPTION OF THE DRAWING

FIG. 7 is a cross sectional view taken along the lines 7, 78 of FIG. 4.

FIG. 9 is an enlarged cross sectional fragmentary view of a switch mechanism in the present invention.

DETAILED DESCRIPTION OF THE PREFERRED EMBODIMENT

Figure 1:
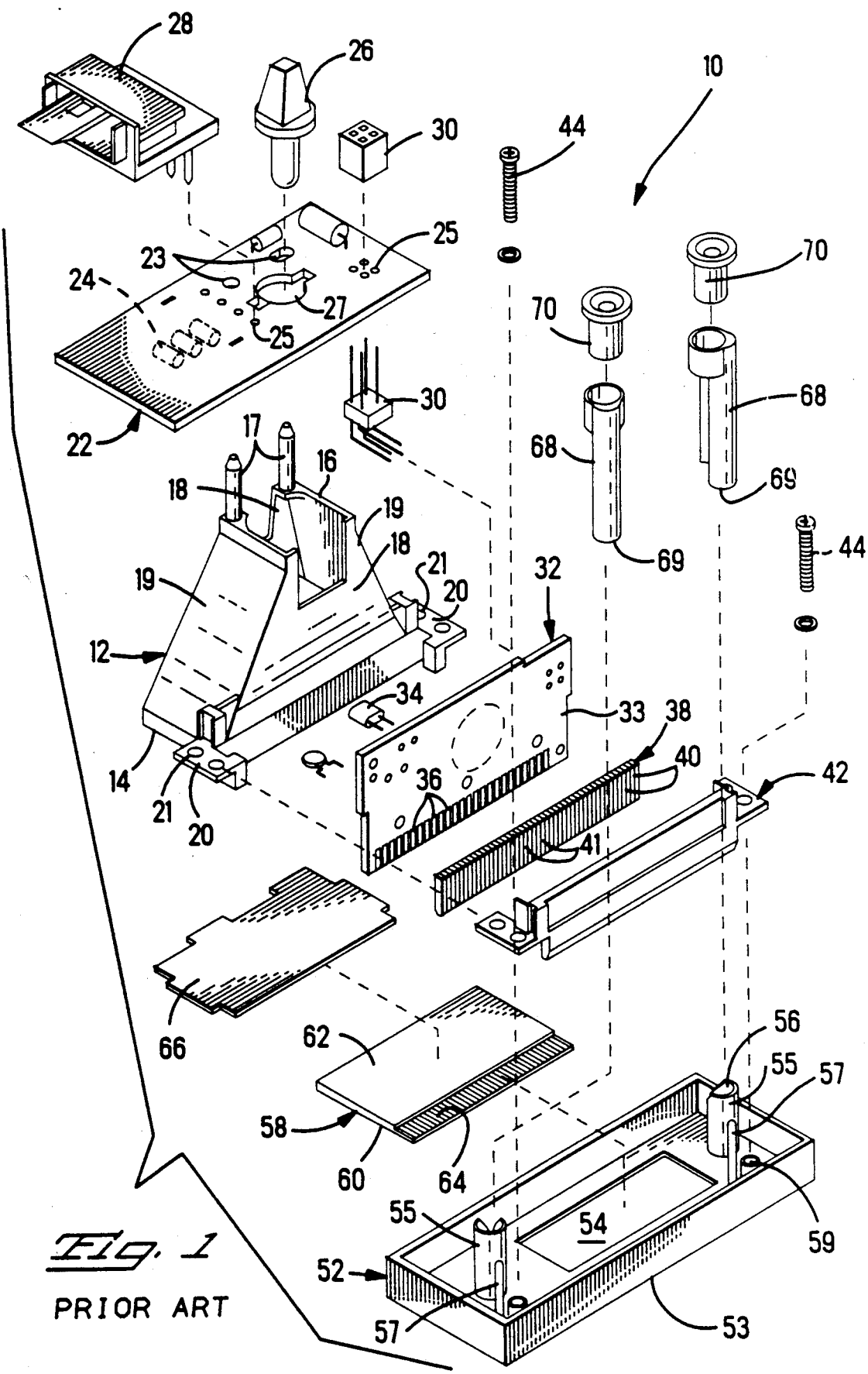
FIG. 1 is an exploded view of a prior art panel mounted clock assembly.
Figure 2:
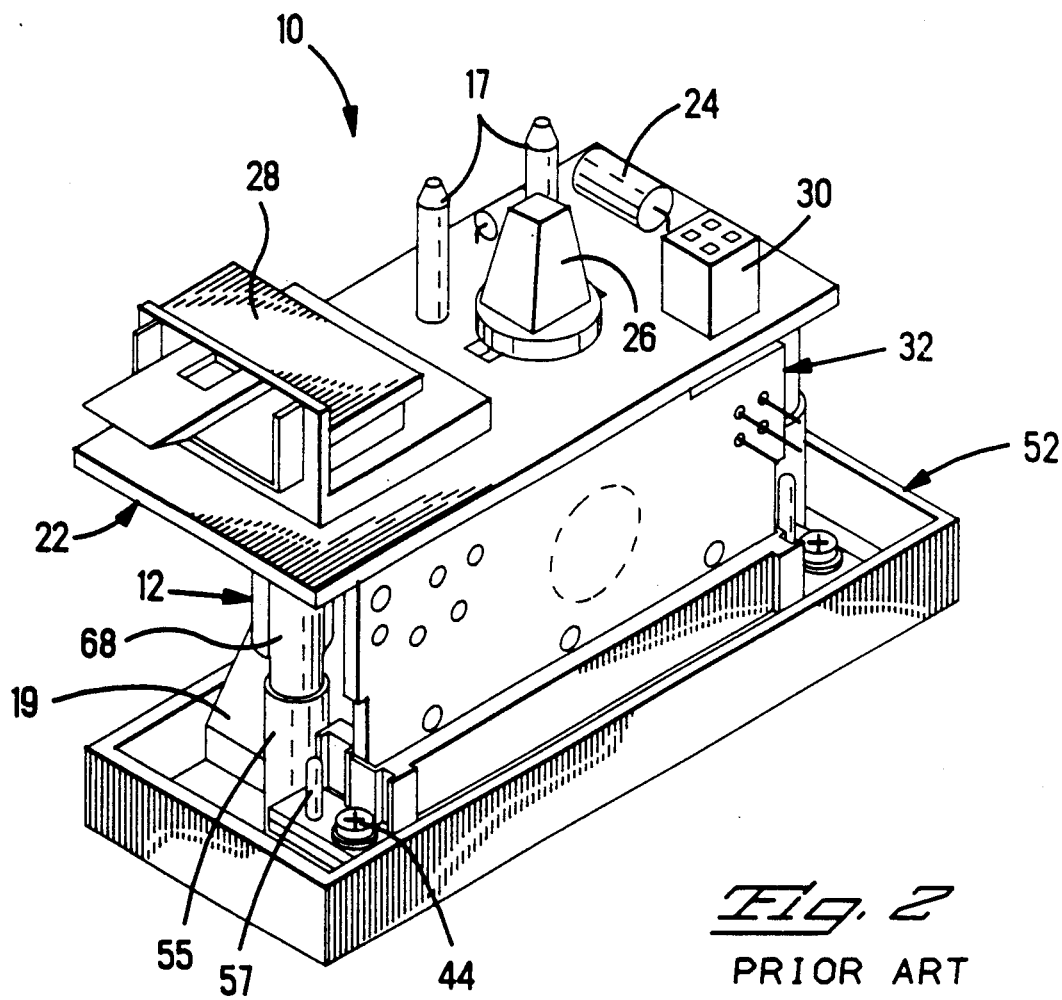
FIG. 2 is an assembled view of the clock of FIG. 1.

FIGS. 1 and 2 illustrate an exploded and assembled view of an electronic assembly 10 of the prior art. For purposes of illustrating the invention, the electronic assembly 10 is shown as a clock assembly for mounting into a panel such as a dashboard of an automobile or the like. Assembly 10 is comprised of a first dielectric member 12 having first and second circuit board members 22, 32 mounted thereto, an electronic package having a plurality of electrical components 24, 34 including a microprocessing unit mounted to respective circuit board members, and an elastomeric connector 38 for engaging circuits 36 on the second circuit board member 32 to corresponding circuits 64 of a liquid crystal display unit 58 for the clock 10.

As best seen in FIG. 1, first dielectric member 12 is a molded member having front face 14 rear face 16 and opposing pairs of side faces 18 and 19. Mounting posts 17 extend outwardly from rear face 16 of the assembly. First member 12 further includes mounting bracket 20 extending outwardly from side face 19. A first circuit board member 22 is mounted to the rear face 16 of molded member 12. Circuit board member 22 includes a plurality of apertures extending therethrough including: apertures 23 for engaging corresponding mounting posts on rear face of first member 12; apertures or plated through-holes 25 for mounting and electrically engaging a plurality of electronic components 24 including a microprocessor, and aperture 27 for receiving a light bulb 26 to provide a light source for the LCD 58 of clock assembly 10. Electrical connector 28 is also mounted to circuit board member 22 for interconnection to a power source (not shown). Electrical connector 30 electrically connects the circuitry between first circuit board member 22 and second circuit board member 32, which is mounted along one side 18 of first member 12. Second circuit board 32 includes a plurality of electronic components 34 mounted thereto and a plurality of conductors 36 extending along the outwardly facing surface 33 of board 32 for electrical engagement with elastomeric connector 38. For purposes of clarity the details of the circuitry on boards 22,32 have been omitted from the drawing. It is to be understood the various components are electrically connected by appropriate circuitry as is known in the art.

Elastomeric connector 38 as best seen in FIG. 1, is a rectangular member of the type made with a plurality of conductive and non-conductive layers 40, 41 such that each conductive layer 40 is exposed along all four edges of the rectangular surface. One such suitable connector is disclosed in U.S. Pat. No. 4,820,170. Elastomeric connector 38 and second circuit board member 32 are configured to be mounted in mounting support means 42 for engagement with mounting bracket 20 on first member 12. The mounting support means 42 holds elastomeric connector 38 in engagement with the outer surface 33 of circuit board member 32 so that corresponding conductive layers 40 are in electrical engagement with conductive areas 36 on circuit board 32.

Second dielectric molded member 52, which forms the face plate for the assembly has an aperture 54 therein for viewing LCD 58. Face plate 52 further includes inwardly directed molded portions 55 having passageway portions 56 extending therethrough for receiving switch means 68, as described hereinafter alignment pins 57 for aiding in assembly of the clock 10 and means 59 for receiving mounting means 44. The electronic clock includes a liquid crystal display member 58 LCD having a front face 60 and a rear face 62. Liquid crystal display member 58 is configured to be received in face plate 52 such that the display can be seen through aperture 54. LCD unit 58 is of the type having a plurality of layers with circuitry disposed therebetween. In the embodiment shown, a plurality of conductors 64 are exposed along an outwardly extending portion of the LCD member 58. The assembly also includes a translucent back panel 66 for LCD member 58.

When assembling the clock 10 of the prior art, and shown in FIG. 2, the liquid crystal display unit 58 and the back panel 66 are placed within the face plate 52. A subassembly comprising first member 12 having first and second circuit board members 22, 33 and their respective components 24, 34 mounted thereto is aligned with face plate 52 such that the front face 14 of member 12 is aligned with opening 54 and alignment apertures 21 on mounting bracket 20 are aligned with aligning pins 57. When aligned, the conductors 40 on elastomeric connector 38 are aligned with corresponding conductors 64 on the rear face of LCD plate 58 thus interconnecting conductors 36 on second circuit member 32 with corresponding conductor 64 on LCD 58. As pressure is exerted by mounting means 44 that secures subassembly in the face plate 52, pressure is applied between the elastomeric connector 38 and the LCD 58 unit to insure continuity of the electrical circuits therebetween.

The clock assembly 10 further includes means for adjusting the time comprised of switch operating post 68 having a conductive elastomeric portion 70 inserted therein. As shown in FIG. 2, switch posts 68 extend to face plate 52 and are disposed in passageway portions 56 thereof and are accessible from the front face 53 of plate 52 (not shown). Posts 68 are operated by applying pressure to the forward facing end 69 of post 68 thus causing the post to move inwardly and cause the conductive elastomeric member 70 to engage electrical circuits on the under side (not shown) of first circuit member 22 to allow corrections to the time shown on the liquid crystal display unit. As can be seen from FIGS. 1 and 2, prior art assembly 10 includes a number of separate pieces.

Figure 3:
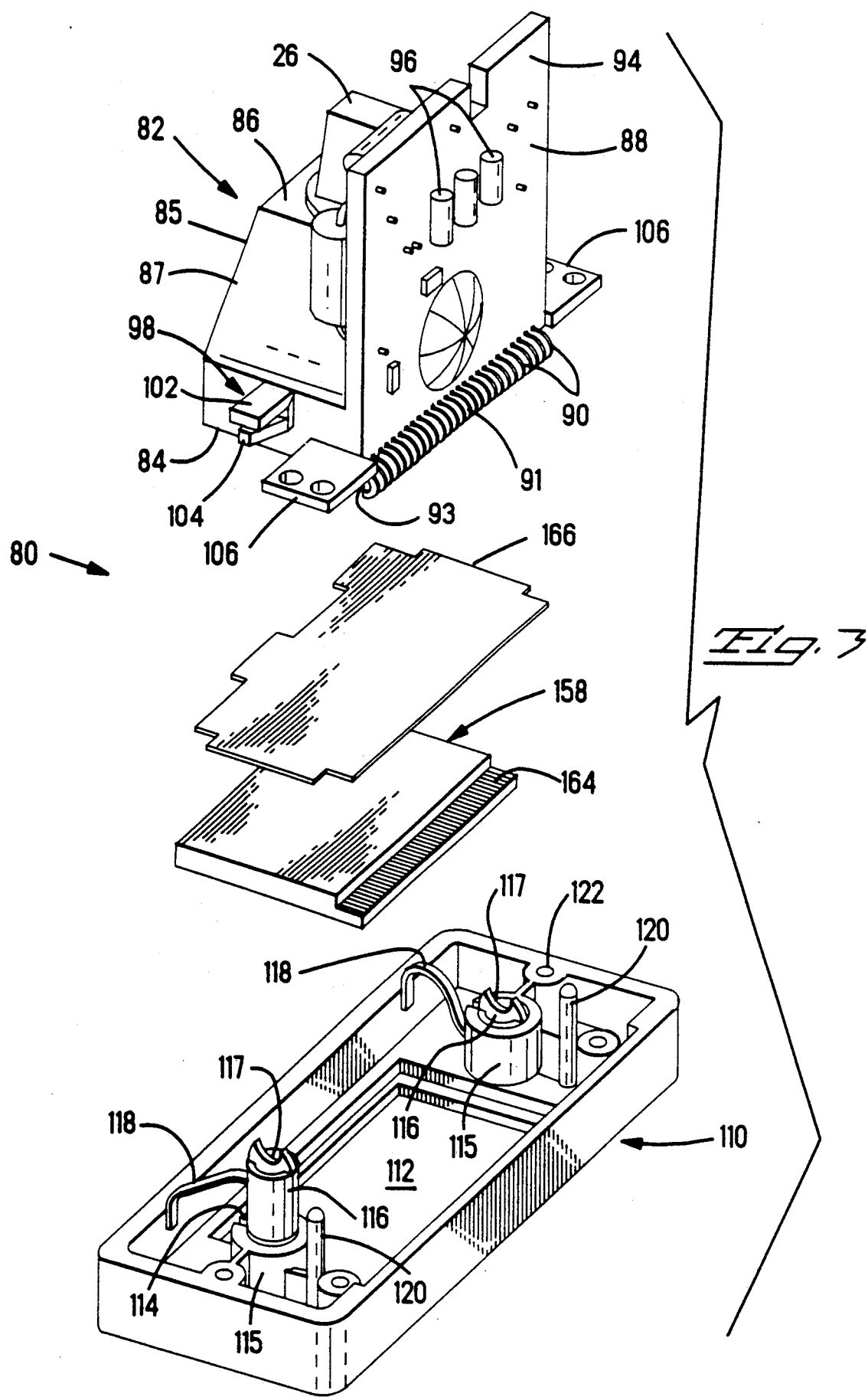
FIG. 3 is an exploded view of the electronic clock assembly of the present invention.
Figure 4:
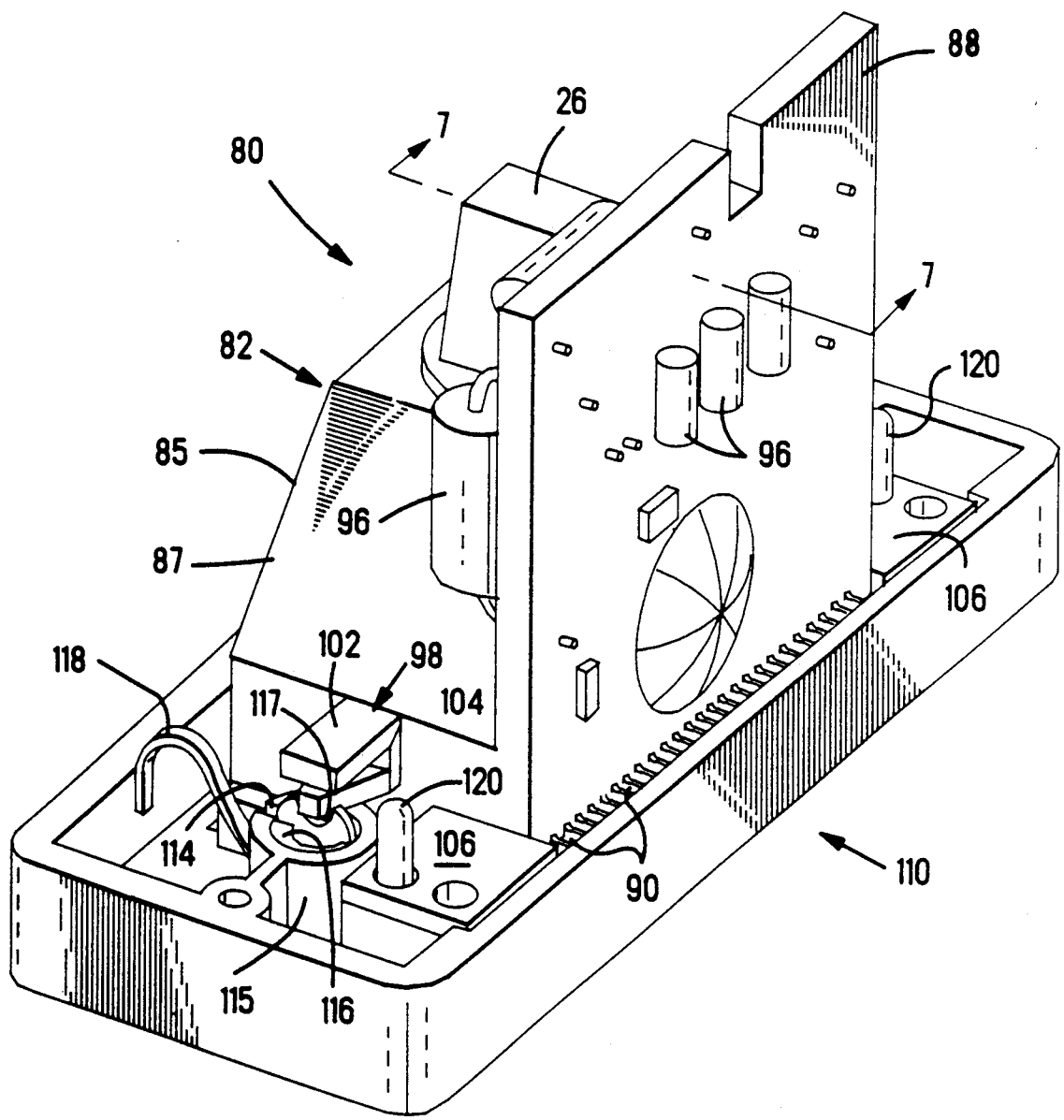
FIG. 4 is an assembled view of the clock of FIG. 3.
Figure 5:
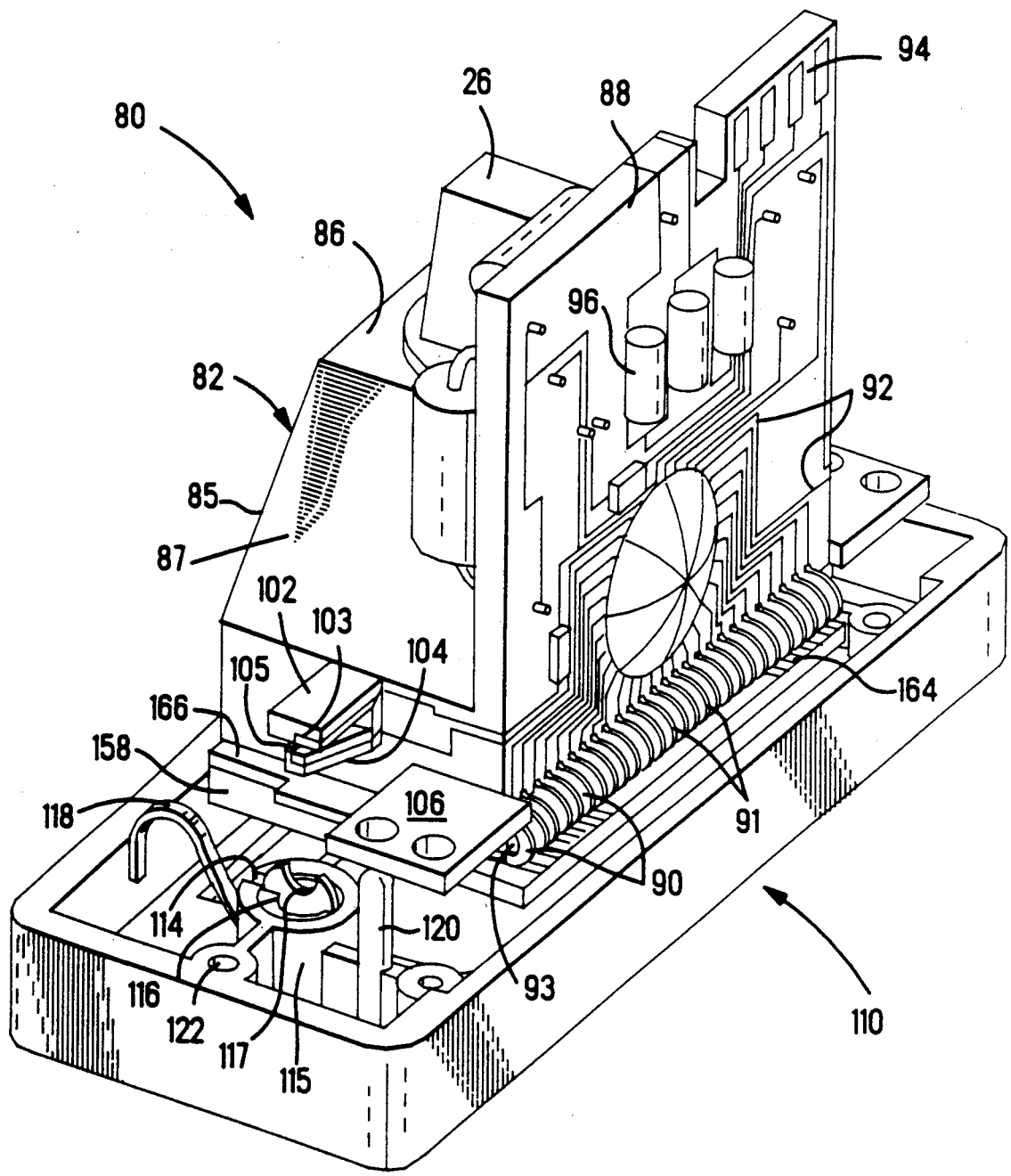
FIG. 5 is a perspective view with the front face panel exploded from the assembled clock of FIG. 4 illustrating the interconnection means of the present invention.

The electronic assembly 80 of the present invention is shown in FIGS. 3 through 9. Referring initially to FIGS. 3, 4 and 5, assembly 80, again shown as a clock, comprises a first molded member 82 having electrical components 96 mounted thereto and a second molded member 110, a liquid crystal display unit 158 and a display back panel 166. For purposes of clarity, the electronic circuitry interconnection of the various components and LCD is eliminated from FIGS. 3 and 4. The circuitry is shown in more detail in FIGS. 5 and 6.

In accordance with the invention and, as best seen in FIG. 3, first member 82 is a molded member having a front face 84 a rear face 86, a first side face 85 opposed side faces 87, and an extended second side face 88 including a plurality of compliant spring portions 90 molded integrally therewith. Side face 88 further includes a plurality of apertures 89 forming through-holes for mounting a plurality of components 96 of an electronic package therein. Side face 88 further includes an interconnection region 94 (as best seen in FIG. 5) for connecting to contact means on the framework (not shown) such as a power source. As shown in FIG. 5, first molded member 82 further includes circuit means 92 defined along outside surface portions of side 88 and extend along the outwardly facing surfaces 91 of the compliant spring portions and to the interconnection region 94. A plurality of components 96 are included in the circuit means to define the appropriate electronic package.

Figure 6:
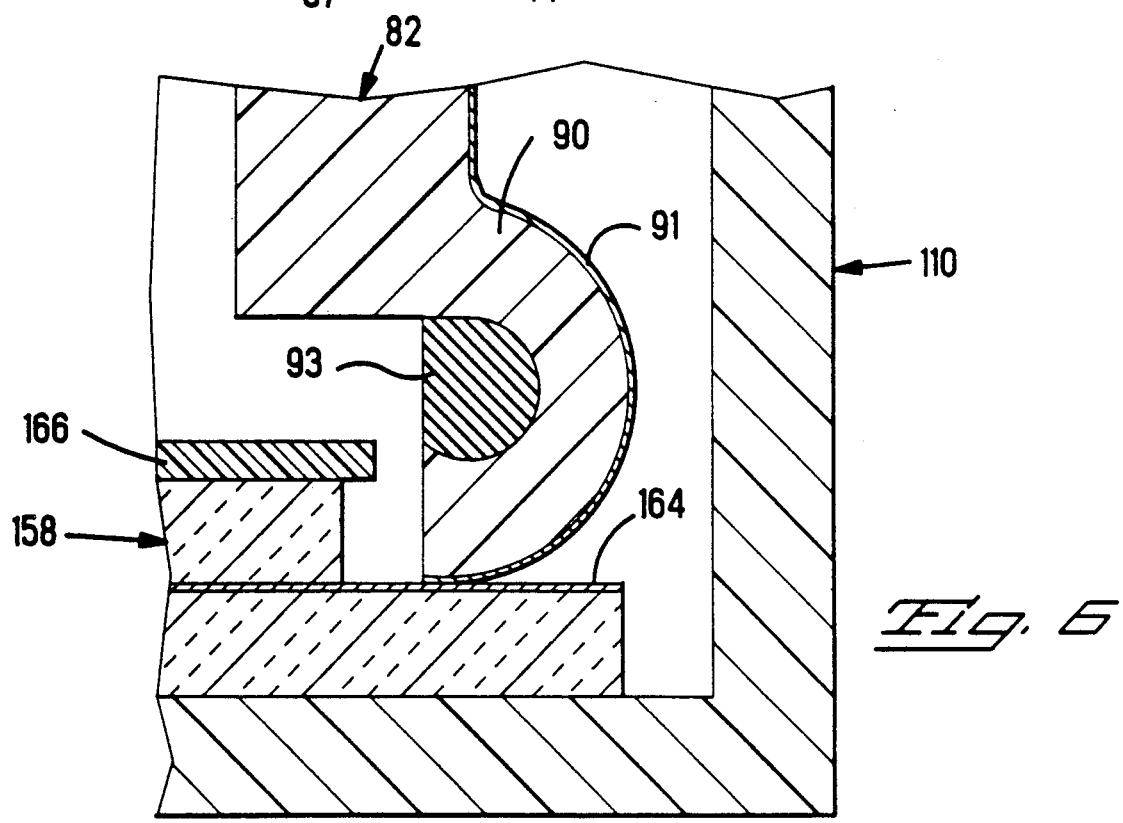
FIG. 6 is an enlarged exploded view of a portion of FIG. 5.

Referring again to FIGS. 3 & 4, representative clock assembly 80 of the present invention further includes a bulb 26 extending through the rear face 86 of the molded member 82. Molded member 82 also includes switch means 98 having a stationary arm 102 and a cantilevered beam portion 104 and mounting means 106 extending outwardly along respective sides 87 thereof. Further integrally molded with the first member is an elastomeric portion 93 that lies against the inner curved surfaces of the compliant beam portions 90 to provide a constant load against the spring fingers. When member 82 is used with a liquid crystal display unit, approximately 50 grams of normal force is required between the compliant spring portions 91 and the corresponding conductors 166 on the liquid crystal display 158 to maintain electrical connection therebetween. As best seen in FIG. 6, LCD 158 is of the same type as previously described.

Second molded member or face plate 110 has aperture 112 therein for viewing the liquid crystal display, alignment pins 120 for aiding and aligning the assembly of the clock, mounting apertures 122 and switch means comprising inwardly extending portions 115 having apertures 114 therein for receiving integrally molded switch means 116, which is attached to face plate 110 by strap means 118.

Figure 8:
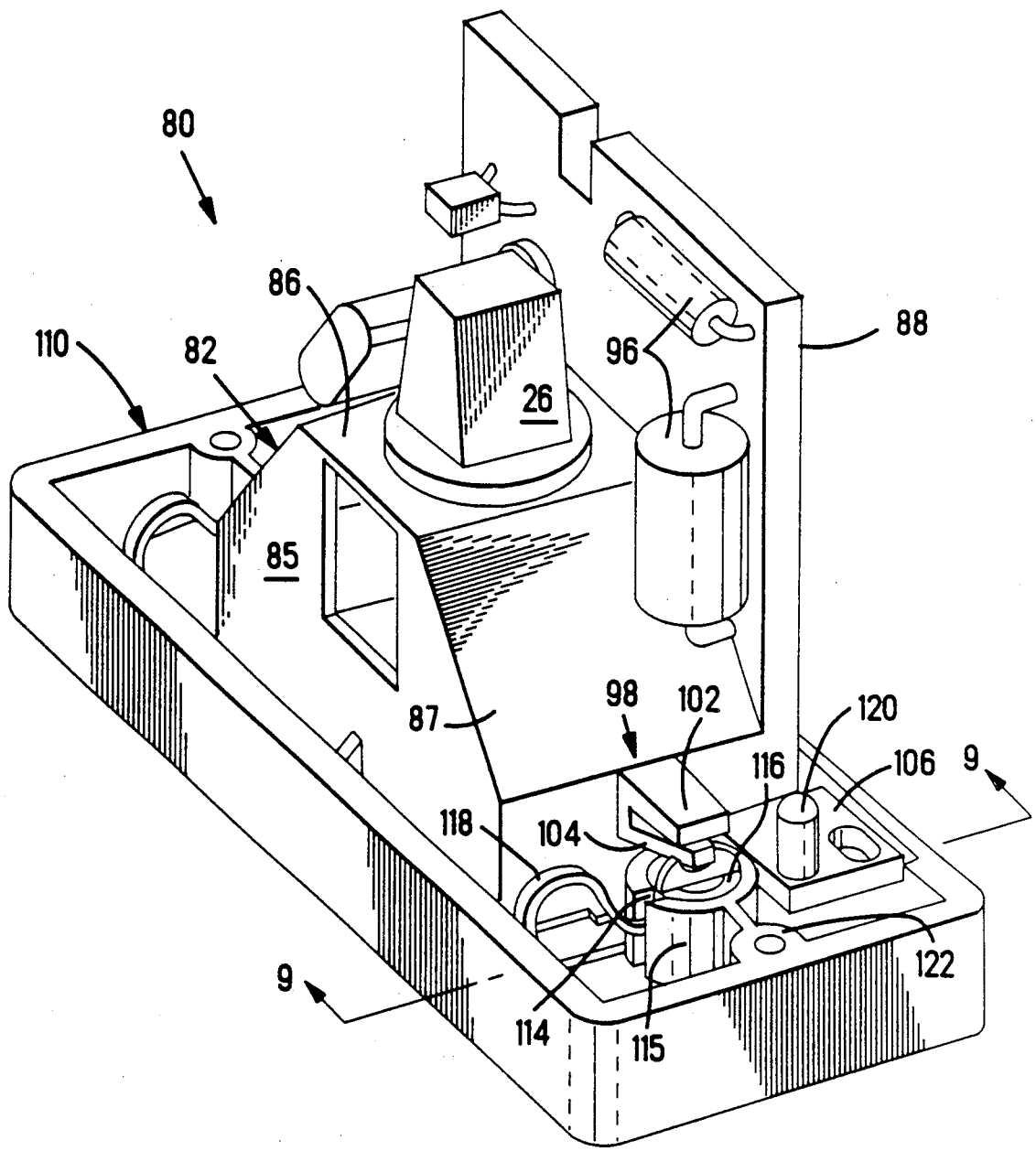
FIG. 8 is a perspective view taken from the front of the assembled clock of FIG. 4.

In assembling the clock of the present invention, as best seen in FIGS. 4 and 7 and 8, the liquid crystal display 158 having circuits 164 exposed thereon and back panel 166 are inserted into face plate 110. Switch portion 116 is inserted into corresponding aperture 114 and the first molded member 82 having components 96 mounted thereon is aligned with and mounted into the corresponding opening such that at the interface between member 82 and LCD/58, the conductive surfaces 91 on compliant beams portions 90 of member 82 engage corresponding circuits 164 of LCD 158 thus effecting electrical connection between the circuit means on compliant beam portions 90 and the corresponding circuits 164 on LCD unit 58. The first member 82 is secured to the second member 110 such as by screws or the like (not shown) inserted into mounting means 106. The alignment of the corresponding conductor surfaces 91 on compliant beam portions 90 with the conductors 164 on LCD 158 is best seen by referring to FIGS. 5 and 6.

FIG. 3 through 5 and 8 also show the alignment between the switch member 116 disposed in aperture 114 of portion 115 and with the switch means 98. As best seen in FIGS. 4 and 8, cantilevered arm 104 of switch means 98 lies in arm receiving surface 117 of member 116. FIG. 5 further representatively illustrates the circuitry interconnecting the various components and compliant spring portions 90 and the conductive surfaces 91 thereon. FIG. 7 shows a cross sectional view of the assembled clock and illustrates the relative position of light bulb 26 in first molded member 82 and the position of member 82 in front face section 110. FIG. 7 further shows the interior of member 82 which includes baffle member 83 that helps to distribute the light from bulb 26.

FIG. 9 is a fragmentary enlarged portion taken in cross section of the switch means along line 9—9 of in FIG. 8. Switch means 98 is in an off position in that compliant arm 104 is spaced from stationary arm 102. When switch portion 116 is depressed from front surface 111 of front face 110, it moves inwardly as indicated by the arrow thus moving compliant portion 104 against stationary arm 102 and the corresponding conductor members 105, 103 respectively on arms 104, 102 in electrical engagement with each other. Upon releasing the pressure on 116 the compression force against cantilevered beam 104 forces member 116 to move in an opposite direction thus disengaging the respective conductors 105, 103. The internal surfaces of the face plate 110 are so configured that a portion 119 of the face plate wall provides a stop for the edge of the strap 118, which prevents member 116 from falling through aperture 114 in face plate 110.

As can be seen by comparing embodiment 10 shown in FIGS. 1 and 2 with embodiment 80 shown in the remaining Figures, and particularly FIGS. 3 and 4, the electronic assembly 80 of the present invention includes fewer parts thereby facilitating manufacturing of the assembly. The main body portion 12 of the present invention is molded in one piece and replaces circuit board members 22,32, the elastomeric connector 38 and the bracket member 42. The second integral molded part eliminates the need for the separate switch members 68,70 since the switch portion is integrally molded into the face plate 110. In the embodiment shown, first molded member 12 is a reflector for the liquid crystal display clock unit and preferably is molded from a white dielectric material.

In forming the one piece member 82, the spring arms 90 are molded as integral and unitary member. In forming the spring members 90 out of a plastic molded part, it is important that the plastic spring member not creep under load or lose the spring characteristics. To overcome any tendency of the spring to relax and to provide constant normal force, it is preferable that resilient member 93 be made from an elastomeric material such as a dynamic vulcanizate or a silicone rubber, is formed inside the curved portion of the spring members 90. One suitable material for the dynamic vulcanizate is Santoprene available from Monsanto Products Company. Santoprene comprises ethylene-propylene-diene monomer (EPDM) rubber particles dispersed in a matrix of polypropylene. Since the basic molded members are typically made from thermoplastic materials, the tendency of the spring arms to creep and relax under stress increases as the operating or environmental temperature increases. The use of a resilient member 93 that has a higher softening point than the typical molding materials used for the molded member 82 continues to provide the necessary support and normal force to the plastic spring members 90 thus permitting connector 80 to be used in elevated temperatures. It is to be understood that the operating temperature is one factor that must be considering for molding members 82,110 and resilient member 93. For example, the Santoprene material has an upper temperature limit of about 125° C. while the upper temperature limit for silicone rubbers is about 200° C.

The resilient member 93 can be formed separately or can be formed in a dual injection molded process wherein after the forming of the first material into the desired shape one or more core pins are moved within the mold to form an additional cavity or cavities for accepting a second material. A number of polymeric materials can be used for the basic molded member 82, such as for example polyetherimide sold under the trade designation ULTEM by GE Plastics, Mount Vernon, Ind.

The face plate member 110 is molded out of a dielectric material having sufficient compliancy to allow the formation of the strap member 118 and the operation of switch. One acceptable material is acrylonitrile butadiene styrene terpolymer (ABS), which is commercially available from several companies.

After molding first member 82, the conductive material of the through-holes, continuous circuit paths and circuit path segments and switch conductors is plated in the desired locations such as by electroless plating techniques as disclosed in U.S. Pat. Nos. 3,629,185; 3,907,621; 3,930,963; 3,993,802; 3,994,727; 4,287,253; 4,511,597; and 4,594,311 and European Patent Application No. 861020550 owned by Kollmorgen Corporation; or by a combination of electroless/electroplating such as disclosed in U.S. Pat. No. 3,042,591; or as disclosed in U.S. Pat. Nos. 4,532,152 or 4,604,799. Typically the processes include treating all exposed surface portions of the molded member for adhesion promotion and coating the surfaces with an ultraviolet light sensitive catalyst as described in U.S. Pat. No. 4,511,597. A masking means opaque to ultraviolet light is then placed over all surfaces of the molded plastic member, which are intended to remain non-conductive. All unmasked surfaces of the catalyzed and masked plastic member including through-holes are exposed to ultraviolet light of appropriate actinic wavelength and energy level to activate the catalyst on the exposed surface areas to render the catalyzed areas receptive to plating of a metal layer thereonto. The masking means is then removed. The catalyst-activated areas are plated such as by electroless plating, or electroplating or a combination thereof, with a first layer of copper about 0.0014 inches thick. A second layer of tin about 0.0002 inches thick is then plated onto the first layer. The plated member thus formed may then be subjected to baking or other post-curing restoration steps and cleaning steps if desired.

Alternatively, the adhesion-promoted plastic member may be selectively coated with plating resist by conventional means, and the exposed areas then electrolessly plated with commercially available plating chemistry. The resist is then removed such as with solvent. Baking or other post-curing restoration steps and cleaning steps may optionally be utilized. Other methods as known in the art may also be used to dispose circuitry on the molded member.

The present invention provides a compact structure for an electronic assembly having a minimum number of parts and one that is cost effective to manufacture. The first member is essentially a connector having an integrally formed elastomeric portion which thereby eliminates the need for separate elastomeric connections and the structures needed to support the same.

Accordingly, it will be appreciated by those skilled in the art that the improved electronic assembly of the present invention provides both compactness or miniaturization while facilitating cost effective production methods.

Obviously many modifications may be made without departing upon the basic spirit of the present invention.

It is thought that the electronic assembly of the present invention and many of its attendant advantages will be understood from the foregoing description. Changes may be made in the form, construction and arrangement of parts thereof without departing from the spirit and scope of the invention or sacrificing all of its material advantages.

We claim:

1. An electronic assembly adapted to be secured to a framework comprising:
   first and second dielectric housing members secureable together at an interface to form an enclosed assembly;
   said first housing member having outwardly facing surface portions including an interconnection region for electrical interconnection to another electrical article and further including a first electronic package, said first housing member being molded of plastic material and including at least one compliant spring portion integral therewith at said interface, said at least one compliant spring portion being adapted to be deflected by engagement means within said second housing member upon assembly of said first and second housing members;
   said first housing member further including first circuit means defined along outwardly facing surface portions of said at least one compliant spring portion, said first electronic package, and further extending to said interconnection region;
   said second housing member including a second electronic package having second circuit means thereon and extending along said engagement means, thereby being engageable with said at least one compliant spring portion; and
   means securing said first and second housing members together with said at least one compliant spring portion held under compression against said second circuit means thus defining said electronic assembly, whereby
   said at least one integral spring portion permits assembly and simultaneous assured electrical interconnection of said first electronic package to said second electronic package with a minimum number of parts to be assembled.

2. The assembly of claim 1 further including elastomeric material supporting said at least one compliant spring portion providing substantial resistance to compression of said at least one spring portion by said engagement means to minimize stress on said at least one spring portion.

3. The assembly of claim 1 wherein said first molded member includes a plurality of molded spring portions.

4. The assembly of claim 3 further including elastomeric material supporting said plurality of compliant spring portions providing substantial resistance to compression of said spring portions by said engagement means to minimize stress on said spring portions.

5. A method for making an electronic assembly adapted to be secured to a framework, the assembly including first and second dielectric housing members securable together at an interface, the method comprising the steps of:
   molding said first housing member of plastic material and including at least one compliant spring portion integral therewith at said interface, said first housing member having outwardly facing surface portions including an interconnection region for electrical interconnection to another electrical article and further including a first electronic package, said at least one compliant spring portion being adapted to be deflected by engagement means within said second housing member upon assembly of said first and second housing members;
   providing first circuit means on said first housing member along outwardly facing surface portions of said at least one compliant spring portion, said first electronic package, and further extending to said interconnection region;
   providing said second housing member including a second electronic package having second circuit means thereon and extending along said engagement means, thereby being engageable with said at least one compliant spring portion; and
   securing said first and second housing members together with said at least one compliant spring portion held under compression against said second circuit means thus defining said electronic assembly.

6. The method of claim 5 further including the step of providing elastomeric material for supporting said at least one compliant spring portion, said material providing substantial resistance to compression to minimize stress on said at least one compliant spring portion.

7. The method of claim 6 wherein said elastomeric material is provided by dual injection molding of said first housing member and said elastomeric material.

8. The method of claim 5 further wherein said molding step includes molding a plurality of compliant spring portions at said interface.

9. The method of claim 8 further including the step of providing elastomeric material for supporting said plurality of compliant spring portions, said material providing substantial resistance to compression to minimize stress on said compliant spring portions.

10. The method of claim 9 wherein said elastomeric material is provided by dual injection molding of said first housing member and said elastomeric material.

* * * * *